United States Patent [19]

Lamberg

[11] Patent Number: 4,763,085
[45] Date of Patent: Aug. 9, 1988

[54] MUTUALLY INJECTION LOCKED MILLIMETER WAVE VOLTAGE CONTROLLED OSCILLATORS WITH POWER COMBINER

[75] Inventor: John R. Lamberg, Minnetonka, Minn.

[73] Assignee: Honeywell, Inc., Minneapolis, Minn.

[21] Appl. No.: 83,071

[22] Filed: Aug. 10, 1987

[51] Int. Cl.⁴ .................. H03B 7/14; H03B 9/14; H03C 3/22
[52] U.S. Cl. ........................ 331/56; 331/99; 331/107 P; 331/107 SL; 332/22
[58] Field of Search ............... 331/56, 47, 48, 55, 331/99, 101, 96, 107 P, 107 SL, 117 D; 332/22, 23 R, 30 V

[56] References Cited

U.S. PATENT DOCUMENTS

| 2,852,678 | 9/1958 | Crapuchettes | 331/90 X |
| 4,185,252 | 1/1980 | Gerlach | 331/56 |
| 4,480,233 | 10/1984 | Juul | 331/56 |
| 4,554,680 | 11/1985 | Jacobs et al. | 455/326 |
| 4,571,555 | 2/1986 | Sigmon et al. | 331/56 |
| 4,583,058 | 4/1986 | McClymonds | 331/107 P |

Primary Examiner—Siegfried H. Grimm
Attorney, Agent, or Firm—Orrin M. Haugen; Thomas J. Nikolai; Frederick W. Niebuhr

[57] ABSTRACT

Disclosed is a circuit for power combining electromagnetic energy in the millimicrowave frequency band where the electromagnetic energy is produced by two substantially identical varactor tuned microstrip oscillators where the power combining circuit has less than perfect isolation properties allowing a fraction of the output of one to be fed back to the other so that the two become locked in frequency.

8 Claims, 1 Drawing Sheet

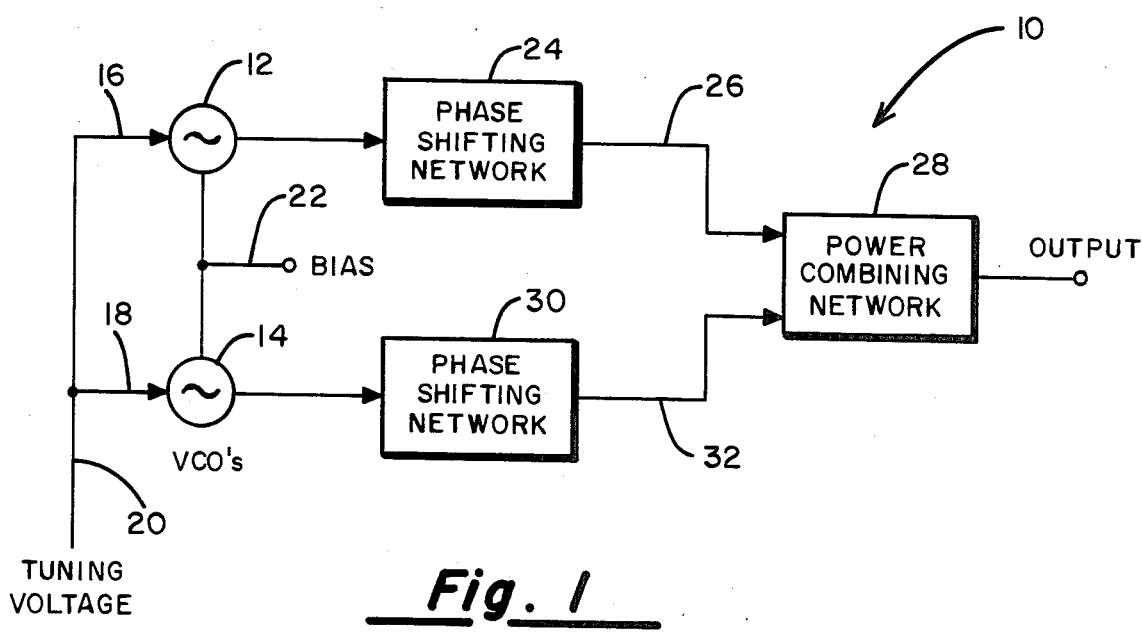
_Fig. 1_
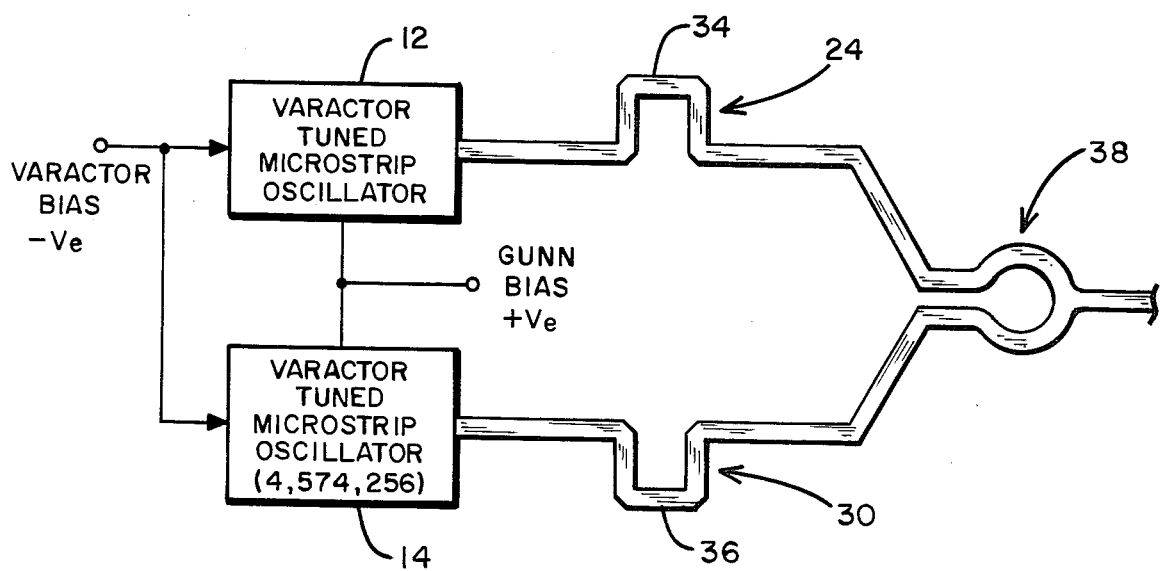
_Fig. 2_

| # MUTUALLY INJECTION LOCKED MILLIMETER WAVE VOLTAGE CONTROLLED OSCILLATORS WITH POWER COMBINER

BACKGROUND OF THE INVENTION

I. Field of the Invention

This invention relates generally to millimeter wave RF power sources for use in transmitting systems, and more particularly to a Ka-band microstrip, high-power RF supply employing a plurality of voltage controlled oscillators whose outputs are power combined in such a way that the plural oscillators become frequency locked by the mutual injection on a signal component from one oscillator into the other through the power combining network.

II. Discussion of the Prior Art

A voltage controlled oscillator (VCO) is an electronic circuit which produces an output signal whose frequency is determined by the amplitude of an externally applied tuning signal. Such oscillators are fundamental components in many radio frequency (RD) systems. For example, they may be found in millimeter wave communication systems, in transmitters for radar and in the seekers or sensors used in extended range precision weapon systems. However, it is found that many applications will require more RF power than can be furnished by a single VCO, especially when working in the MMW frequencies. Thus, various prior art power combining techniques have been devised. At MMW frequencies, wave guide combiners are typically used. In this regard, reference is made to the McClymonds U.S. Pat. No. 4,583,058 as well as to the Sigmon et al U.S. Pat. No. 4,571,555 and the Crapuchettes U.S. Pat. No. 2,852,678. Because of their relatively large size, weight and expense, such an approach may not be an alternative in many applications.

Power combined oscillators of the prior art are generally designed to work at a single, fixed, operating frequency, rather than being variable frequency oscillators. Again, this oft times makes them unsuitable for certain applications. Over and above that drawback, the individual, fixed frequency oscillators used in such prior art circuits must be carefully matched and require exact tuning to assure that each oscillator will be operating at the same frequency. The requirement for careful device matching and exact tuning necessarily increases the cost of such systems quite significantly.

The Jacobs et al U.S. Pat. No. 4,544,680 discloses a triple Gunn diode, self-oscillating, mixer system designed to operate at millimeter wave frequencies. In this system, two fixed frequency Gunn diode cavity oscillators are arranged to mutually injection lock one another by way of a coxial cable connection extending between them. This circuit is designed to assure that the phase difference between the two mutual injection lock signals is 180°. The device of the Jacobs patent is not strictly a power combiner, but is actually a mixer. The signal outputs from the two oscillators in the Jacobs system are applied to an image line 180° hybrid and if the two signals are exactly 180° out-of-phase with respect to one another and are of generally equal amplitude, the algebraic sum of the two signals will appear at a single output port. It is to be noted that, in the Jacobs system, fixed frequency Gunn diode cavity oscillators are employed rather than microstrip implemented VCO's. Furthermore, rather than employing a power combining network whose isolation capability is less than total, in the Jacobs system, a coaxial cable is employed to mutually injection lock the two oscillators and power combining efficiency depends significantly upon the near-ideal isolation characteristics of the combining network.

Fixed frequency power combined oscillators can be made to operate as a variable frequency system by using an external source and an isolating/injecting network, such as a circulator. This technique of changing the frequency of fixed frequency oscillators by injection locking them to an external variable oscillator is well known to those versed in the art. The disadvantages of this approach are the need for an external variable frequency oscillator and a high performance (low loss/high isolation) circulator. This increases the cost, size and complexity of the power combined oscillator system.

SUMMARY OF THE INVENTION

In accordance with the present invention, the respective outputs of two voltage controlled oscillators are coupled through phase shifting networks, such as fixed length transmission lines, to the inputs of a power combining network which is specifically designed to have a predetermined isolation characteristic which is markedly less than what can be considered as ideal. As such, a small fraction of the output signal from the first oscillator is fed back through the power combining network and the phase shifting circuit associated with the second variable frequency oscillator and, likewise, a portion of the output of the second oscillator is fed back through the phase shift circuit associated with the first oscillator whereby the two become mutually injection locked and will oscillate at an identical frequency. Due to the appropriate selection of the electrical lengths of the transmission lines comprising the phase shifters, the mutually injection locked oscillators produce in-phase signals at the power combiner's two inputs. It is found that when the free-running frequency of the two voltage-controlled oscillators is varied by varying the control voltage applied to their respective tuning elements, highly efficient power combining takes place over a broad tuning bandwidth.

Due to the mutual injection locking and the appropriate selection of the electrical lengths of the transmission lines comprising the phase shifting networks, the VCO's can be driven from only two, rather than four, power supplies. Specifically, one power supply is used to provide the identical DC bias voltage to the active devices in the two VCO's while the other power supply provides an identical tuning voltage to the tuning devices incorporated in the VCO's.

The present invention produces highly efficient power combining over a broad tuning bandwidth using two or more VCO's at MMW frequencies and obviating the need to carefully match such oscillators. In that the invention can be implemented using microstrip technology, low-cost, small, light-weight RF power supplies can be realized.

OBJECTS

It is accordingly a principal object of the present invention to provide a means for power-combining the outputs from two voltage-controlled oscillators operating in the MMW frequency range.

Another object of the invention is to provide a power source in which two voltage-controlled oscillators are intercoupled with a power combiner exhibiting less than ideal isolation characteristics whereby the oscillators are effectively cross-coupled allowing mutual injection locking to take place.

Yet another object of the invention is to implement a power source for use in millimeter wave applications using microstrip technology throughout.

A still further object of the invention is to provide a system in which two or more variable frequency oscillators are mutually injection locked through an associated power combining circuit whereby highly efficient power combining is obtained over a broad, electronically controlled, tuning bandwidth.

These and other objects and advantages of the invention will become apparent to those skilled in the art from the detailed description of a preferred embodiment, especially when considered in conjunction with the accompanying drawings in which like numerals in the several views refer to corresponding parts.

DESCRIPTION OF THE DRAWINGS

FIG. 1 is a block diagram representation of the present invention; and

FIG. 2 depicts a microstrip mutually injection locked power combined voltage controlled oscillator in accordance with the present invention.

DESCRIPTION OF THE PREFERRED EMBODIMENT

Referring to FIG. 1, there is indicated generally by numeral 10 a power combined voltage controlled oscillator system incorporating a first VCO 12 and a second VCO 14 having control inputs 16 and 18, respectively. The tuning voltage applied to line 20, and hence, to inputs 16 and 18 will typically be a direct current potential which can be varied. The tuning voltage applied to line 20 can either be a dc potential which can be manually varied, or a time varying potential which will provide a time varying operating frequency for frequency modulation (FM) applications. In addition, VCO's 12 and 14 incorporate active elements requiring a predetermined constant bias voltage which, too, may originate at a direct current power supply coupled to the bias terminal 22. The output of oscillator 12 is coupled through a phase shifting network 24 to a first input 26 of a power combiner 28. Similarly, the output voltage from the VCO 14 is coupled through a phase shifting network 30 to a second input 32 of the power combining network 28.

In accordance with the present invention, the power combining network 28 is designed to have non-perfect isolation whereby a small portion of the output of each oscillator 12 and 14 is injected into the other by feedback from the combiner and through the respective phase shifting networks 24 and 30. By properly choosing the isolation of the power combining network and by properly choosing the phase shift provided by the phase shifting networks, the oscillators 12 and 14 will be caused to injection lock with each other and thus will oscillate at the same frequency. The same phase setting will also result in the two signals from the oscillators being in-phase at the inputs 26 and 32 of the combiner 28. Once mutual injection locking has taken place, the tuning voltage applied to line 20 may be varied over a significant range to vary the common frequency of the two oscillators 12 and 14 over a fairly broad bandwidth. The circuit also exhibits a free-running (unlocked) frequency alignment between the plural VCO's which is relatively non-critical. Thus, there is no need for precise RF matching between them.

With reference to FIG. 2, it can be seen that the present invention may be implemented using microstrip technology in which the voltage controlled oscillators 12 and 14 may each comprise a varactor-tuned microstrip oscillator designed for Ka band operation, the constructional details of which are fully set out and described in the Singh U.S. Pat. No. 4,574,256 which is assigned to the assignee of the present invention and which is thereby incorporated by reference. The phase shifting networks 24 and 30 may comprise transmission lines 34 and 36 whose lengths are chosen to maximize the mutually injection locked tuning range and to provide an in-phase condition between the signals applied to the inputs of a Wilkinson power combiner which is indicated generally by numeral 38. Those desiring additional information on such power combiners are referred to a publication entitled "An N-Way Hybrid Power Divider", E. J. Wilkinson, *IRE Transactions on Microwave Theory and Techniques,* Vol. MTT-8, No. 1, pp. 116-118, January 1960. The power combiner 38 may typically have a minimum isolation of 10 dB and a maximum desired isolation of 20 dB with, perhaps, the optimum being approximately 15 dB. Whereas in prior art power combiners an effort is made to realize a network exhibiting a high level of isolation (typically of 30 dB), in the case of the present invention, a small fraction of the total output signal is fed back from each of the plural oscillators to the other whereby mutual injection locking will take place.

It is found that the electrical lengths of the two transmission lines 34 and 36 used to connect the varactor-tuned microstrip oscillators 12 and 14 to the Wilkinson power combining network 38 have a significant influence on the RF performance of the power combined oscillator. When the electrical lengths are correctly chosen, highly efficient power combining is attained. It is found, however, that power cancellation can occur if the electrical lengths of the transmission lines 34 and 36 are not correctly chosen. The electrical lengths of the two transmission lines 34 and 36 also have a significant influence on the tuning bandwidth over which the plural VCO's mutually injection lock one another. When the electrical lengths are correctly chosen, the timing bandwidth is maximized. It is found, however, that a very limited during bandwidth can occur if the electrical lengths of 34 and 36 are not correctly chosen.

As is explained in the aforereferenced Singh Patent, each of the VCO's 12 and 14 consists of a Gunn diode for RF power generation, a varactor diode for tuning, printed microstrip impedance matching elements, a printed dc block and two printed bias filters which are used to decouple RF from the dc inputs. The VCO also uses chip resistors and capacitors in the dc bias circuits.

The power combining network 38 uses the well-known Wilkinson configuration. When implemented using microstrip construction, this circuit provides an isolation of approximately 15 dB at 35 GHz. While there are other microstrip power combining networks which provide improved isolation at this frequency, to achieve good injection locking, isolation at the 15 dB level has been found to provide excellent results.

A high power VCO constructed in accordance with the teachings of the present invention has been shown to exhibit good mutual injection locking over an electrical tuning bandwidth of almost 1 GHz. At the same time, an output power, in excess of one-fourth watt, remains flat over its entire tuning bandwidth. To put this in context, this 250 mW power level was obtained using two GaAs Gunn diodes, each capable of producing 200 mW in a low-loss waveguide cavity. The resulting output power from the subject invention includes all circuit losses, such as varactor loss, line loss and power combining efficiency. Microstrip transmission is known to be very lossy, compared to waveguide transmission. A total loss of 10 log (250/400) = −2 dB is considered very good for a microstrip VCO. It is believed that the circuit is capable of producing one-half watt if two InP Gunn diodes, each rated for 400 mW, are used in place of the 200 mW GaAs Gunn diodes.

Obviously, numerous modifications and variations of the present invention are possible in light of the above teaching. For example, the invention has been described using varactor tuned Gunn diode VCO's of a microstrip construction. However, the fundamental design concepts which make the invention operable are applicable, to any frequency, transmission media, or oscillator construction. For example, with appropriate circuit design, a power combined transistor VCO could be realized using a coaxial transmission medium at 1 GHz. The same fundamental design rules may be used to realize a 94 GHz waveguide power combined Gunn diode VCO. It is, therefore, to be understood that within the scope of the appended claims, the invention may be practiced otherwise then as specifically described herein.

What is claimed is:

1. Apparatus for power combining the outputs from at least two variable frequency signal sources comprising:
   (a) first and second variable frequency oscillators operable at millimeter wave frequencies;
   (b) power combining means having a pair of input terminals and a single output terminal, said power combining means exhibiting an isolation factor between said pair of input terminals in the range of from 10 to 30 dB; and
   (c) phase shifting means coupling the outputs of said first and second variable frequency oscillators to respective ones of said first and second input terminals of said power combining means, the arrangement being such that a fraction of the output signal of each of said first and second variable frequency oscillators is injected through said phase shifting means into the other of said first and second variable frequency oscillators to effect frequency locking of said first and second variable frequency oscillators at a common frequency.

2. The apparatus as in claim 1 wherein said first and second variable frequency oscillators are each voltage controlled oscillators.

3. The apparatus as in claim 2 wherein said voltage controlled oscillators are varactor-tuned Gunn diode oscillators.

4. The apparatus as in claim 1 wherein said phase shifting means creates an in-phase condition between the signals from said first and second variable frequency oscillators applied to said pair of input terminals of said power combining means.

5. The apparatus as in claim 1 wherein said power combining means exhibits an isolation factor of 15 dB.

6. The apparatus as in claim 3 wherein said voltage controlled oscillators are of a microstrip construction.

7. The apparatus as in claim 4 wherein said phase shifting means comprises microstrip transmission lines of a predetermined length.

8. The apparatus as in claim 1 wherein said power combining means comprises a Wilkinson power combiner.

* * * * *